(12) United States Patent
Ma et al.

(10) Patent No.: US 10,270,450 B1
(45) Date of Patent: Apr. 23, 2019

(54) UNIFIED LOW POWER BIDIRECTIONAL PORT

(71) Applicant: Xilinx, Inc., San Jose, CA (US)

(72) Inventors: Shaojun Ma, San Jose, CA (US); Parag Upadhyaya, Los Gatos, CA (US); Didem Z. Turker Melek, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/110,937

(22) Filed: Aug. 23, 2018

(51) Int. Cl.
| | |
|---|---|
| *H03K 19/0185* | (2006.01) |
| *H03H 11/28* | (2006.01) |
| *H03K 19/0175* | (2006.01) |
| *H04B 3/04* | (2006.01) |
| *H03K 17/0812* | (2006.01) |
| *H03K 19/018* | (2006.01) |
| *H04B 1/04* | (2006.01) |

(52) U.S. Cl.
CPC ..... *H03K 19/018592* (2013.01); *H03H 11/28* (2013.01); *H03K 17/08122* (2013.01); *H03K 19/017581* (2013.01); *H03K 19/018578* (2013.01); *H04B 3/04* (2013.01); *H03K 2217/0036* (2013.01)

(58) Field of Classification Search
CPC combination set(s) only.
See application file for complete search history.

(56) References Cited

U.S. PATENT DOCUMENTS 7,353,007 B2 * 4/2008 Carballo ............... H04L 25/028
330/251

OTHER PUBLICATIONS

Frans, Y. et al., "A 40-to-64 Gb/s NRZ Transmiiter With Supply—Regulated Front-End in 16 nm FinFET", IEEE Journal of Solid-State Circuits, vol. 51, No. 12, Dec. 2016, pp. 3167-3177.

* cited by examiner

*Primary Examiner* — An T Luu
(74) *Attorney, Agent, or Firm* — Craige Thompson

(57) ABSTRACT

Methods and apparatus relate to a bidirectional differential interface having a voltage-mode transmit driver architecture formed of multiple selectively enabled slices for coarse output resistance impedance matching. In an illustrative example, the transmit driver may include a programmable resistance for fine-tuning to impedance match the output resistance for transmit operation. During receive operation, protective voltage may be proactively applied to gates of drive transistors, for example, to minimize voltage stresses applied by external signal sources. Some implementations may automatically float the sources of the drive transistors, for example, to prevent back-feeding externally driven signal currents during receive mode operations. The transmit driver may have programmable voltage swing on, for example, the upper and/or lower bounds to enhance compatibility. A programmable common mode voltage node may be selectively applied, for example, through common mode resistors for receive mode operations. Various embodiments may reduce pin count for high speed bidirectional I/O.

20 Claims, 10 Drawing Sheets

UNIFIED LOW POWER BIDIRECTIONAL PORT

TECHNICAL FIELD

Various embodiments relate generally to interface circuits to low voltage core devices.

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network. Modern networks may employ a number of mediums including physical wires, radio frequency (RF) channels or fiber optics. Data exchanged between computing devices may include data packets including multiple bits.

When high-speed digital data is exchanged using differential pairs, the link between a transmitter and a receiver may form a transmission line. High-speed transmission lines may be characterized for their characteristic impedance. Reflections within the transmission line may be minimized when signals traveling a length of transmission line experience a substantially continuous characteristic impedance. Termination resistors may be employed at the ends of various transmission lines to provide impedance continuity. Minimizing reflections may increase signal integrity of data traveling on a transmission line, which may advantageously decrease bit error rate, and may permit increases in transmission distance and/or transmission speed.

SUMMARY

Methods and apparatus relate to a bidirectional differential interface having a voltage-mode transmit driver architecture formed of multiple selectively enabled slices for coarse output resistance impedance matching. In an illustrative example, the transmit driver may include a programmable resistance for fine-tuning to impedance match the output resistance for transmit operation. During receive operation, protective voltage may be proactively applied to gates of drive transistors, for example, to minimize voltage stresses applied by external signal sources. Some implementations may automatically float the sources of the drive transistors, for example, to prevent back-feeding externally driven signal currents during receive mode operations. The transmit driver may have programmable voltage swing on, for example, the upper and/or lower bounds to enhance compatibility. A programmable common mode voltage node may be selectively applied, for example, through common mode resistors for receive mode operations. Various embodiments may reduce pin count for high speed bidirectional I/O.

Various embodiments may achieve one or more advantages. For example, some embodiments may receive and/or transmit data or a clock signal for a phase locked loop (PLL). In TX (transmit) mode, the clock signal may be driven by a voltage mode transmitter circuit built on thin-oxide processes running on a low core voltage (e.g., supply voltage of 0.8V-0.9V), which may provide fast edge rates. The port may include a bidirectional transmit/receive buffer using shared input/output (I/O) path and pin pair. The shared I/O implementations may advantageously reduce the number of pins or "bumps" on a semiconductor package, which may lower product size and/or production costs and improve circuit density, for example, by reducing the number of dedicated pins from four (e.g., for separate differential transmit and receive ports) to two bidirectional pins configured for transceiver operation.

Various voltage mode transmitter (TX) implementations may further achieve at least 50-60% or more power reduction compared to current mode logic (CML), for example, while still supporting relatively large output swings. Various transmit driver embodiments may employ a programmable I/O voltage swing and/or a programmable output impedance. Various implementations, when configured in a transmit mode, an impedance control loop may fine-tune output resistance to, for example, optimize output impedance, which may result in improved return loss performance. Some embodiments may further provide controlled output voltage swing, which may be accurately controlled by the impedance control loop.

Some receive (RX) mode implementations may substantially improve common mode return loss (e.g., S22 parameter) by, for example, about 20 dB. Various receive buffers may allow flexibility for a wide range of input voltage swings, which may support legacy standards for extended compatibility with, for example, higher voltage devices (e.g., memory circuits). Improved common-mode performance in RX mode may be achieved, for example, by a programmable I/O common mode voltage, which may be combined with programmable common-mode termination resistance, which may yield improved bandwidth performance.

In RX mode, various features of some embodiments may incorporate voltage stress protection features to allow the TX circuits to withstand the stresses applied to the TX stage. Such protection features may facilitate safe operation with legacy systems (e.g., higher voltage rating) while permitting the TX stage to be constructed with a high performance speed, low voltage (e.g., 0.9V, thin oxide) process construction. Some embodiments may ensure that, in RX mode, the gate voltage of each of the TX output transistors is proactively positioned to a predetermined level such that an incoming RX signal from, for example, a higher voltage legacy device, will not exceed safe operating voltage ratings for any gate-to-source or gate-to-drain voltage junctions in the TX output stages. Further, some implementations may substantially prevent conduction through the protected TX output transistors by selectively interrupting the electrical current paths for the RX signal through the TX output circuits.

Various implementations may substantially eliminate or avoid lifetime degradation of fabricated devices (e.g., thin-oxide transistors). Inclusion of both transmit driver circuits and receive buffer circuits configured as bidirectional I/O may operate with minimum allowable core voltages. Operation at core voltages may extend, in some embodiments, to sub 1-volt thin-oxide cores, while simultaneously protecting thin-oxide devices from over-voltage stresses while maintaining reliable operation.

In one exemplary aspect, a bidirectional interface apparatus includes a pair of terminals (305, 310) configured to electrically connect to a differential circuit, and a pair of electrical nodes, each of the electrical nodes electrically coupled to a corresponding one of the pair of terminals. The apparatus further includes a transmit driver circuit (325) coupled to each of the pair of terminals via the pair of electrical nodes, wherein the transmit driver circuit comprises two or more slices. Each of the two or more slices includes: (a) an output driver circuit (Q4-Q7), and a programmable pre-driver circuit (U4-U7) coupled to selectively enable or disable the output driver circuit in the same slice in response to an enable signal. In some embodiments, when the output driver is selectively enabled by the programmable pre-driver circuit, the output driver circuit may be operable to drive a differential output signal onto the pair of electrical nodes in response to a data signal (DIN). The apparatus further includes a receive buffer circuit (330) coupled to each of the pair of terminals via the pair of electrical nodes. In some embodiments, the receive buffer circuit (330) may be operable, in a receive mode, to receive incoming differential signals via the pair of electrical nodes. The apparatus also includes a control circuit coupled to the transmit driver circuit and configured, in some embodiments, when operating in a transmit mode, to selectively generate the enable signal for each slice in the two or more slices. The control circuit is configured to determine a number of the slices to selectively enable as a function of the transmit driver circuit (325) output resistance.

In various embodiments, in the receive mode, the programmable pre-driver circuit may be configured to supply a predetermined operating voltage to a control terminal of each of a plurality of transistors in the transmit driver circuit (325), wherein each of the two or more transistors in the transmit driver circuit (325) may directly connect to the pair of electrical nodes. The transistors in the transmit driver circuit (325) may include CMOS devices formed with a thin gate dielectric construction. The predetermined operating voltage supplied to the control terminal of each of the transistors in the transmit driver circuit (325) may be between about 0.6V and about 1.0V.

In some examples, in response to the receive mode, a switch may be selectively opened to interrupt a current from at least one of the pair of electrical nodes to a reference potential (GND). The current path may run through at least a portion of the transmit driver circuit (325). The apparatus may further include a first variable resistance circuit (Q1, R1) configured to adjust an output resistance of the output driver circuit in response to a first variable resistance control signal (P3). The apparatus may further include a high side voltage regulator circuit configured to supply a regulated upper voltage (VREFP) via the first variable resistance circuit (Q1, R1). The output driver circuit (325) in each slice may be configured to drive an output signal as a differential output signal with an upper bound voltage swing established by the regulated upper voltage. The transmit driver circuit may further include a second variable resistance circuit (Q2, R2) connected between the transmit driver circuit (325) and a circuit reference potential (GND) and may be configured to adjust an output resistance of the output driver circuit in response to a second variable resistance control signal (P4).

The apparatus may further include a resistive terminator network (335) connected between the pair of electrical nodes. The network may be operable, in response to the receive mode, to close a first switch (SW4) and a second switch (SW5) to make electrical connections from a common mode node (410) to each of the nodes in the pair of electrical nodes. Each of the made connections may be though a resistance (R7, R8) sized to substantially match a common mode impedance characteristic. The resistive terminator network (335) may be further operable, in response to the transmit mode, to open the first switch (SW4) and the second switch (SW5). The common mode node (410) may be driven to a predetermined regulated voltage.

In another exemplary aspect, a method of operating a bidirectional interface apparatus may include electrically connecting a pair of terminals (305, 310) to a differential circuit, and electrically coupling a pair of electrical nodes to a corresponding one of the pair of terminals. The method also includes coupling a transmit driver circuit (325) to each of the pair of terminals via the pair of electrical nodes. The transmit driver circuit includes two or more slices, each slice in the two or more slices includes: (a) an output driver circuit (Q4-Q7); and, (b) a programmable pre-driver circuit (U4-U7) coupled to selectively enable or disable the output driver circuit in the same slice in response to an enable signal. In some embodiments, when the output driver may be selectively enabled by the programmable pre-driver circuit, the output driver circuit is operable to drive a differential output signal onto the pair of electrical nodes in response to a data signal (DIN). The method further includes coupling a receive buffer circuit (330) to each of the pair of terminals via the pair of electrical nodes. In a receive mode, the method includes receiving, with the receive buffer circuit (330), incoming differential signals via the pair of electrical nodes; in some embodiments, when operating in a transmit mode, selectively generating, with a control circuit coupled to the transmit driver circuit, the enable signal for each slice in the two or more slices. The method further includes determining, with the control circuit, a number of the slices to selectively enable as a function of the transmit driver circuit (325) output resistance.

In various examples, the method may further include, in the receive mode, supplying, with the programmable pre-driver circuit, a predetermined operating voltage to a control terminal of each of two or more transistors in the transmit driver circuit (325). Each of the two or more transistors in the transmit driver circuit (325) may directly connect to the pair of electrical nodes. The method may further include providing CMOS devices formed with a thin gate dielectric construction as the two or more transistors in the transmit driver circuit (325). The predetermined operating voltage may be between about 0.6V and about 1.0V. In response to the receive mode, the method may include selectively opening a switch to interrupt a current from at least one of the pair of electrical nodes to a reference potential (GND), wherein the current path runs through at least a portion of the transmit driver circuit (325).

The method may further include adjusting, with a first variable resistance circuit (Q1, R1), an output resistance of the output driver circuit in response to a first variable resistance control signal (P3). The method may further include supplying, with a high side voltage regulator circuit, a regulated upper voltage (VREFP) via the first variable resistance circuit (Q1, R1). The method may further include driving, with the output driver circuit (325) in each slice, an output signal as a differential output signal with an upper bound voltage swing established by the regulated upper voltage. Further, the method may include adjusting, with a second variable resistance circuit (Q2, R2) connected between the transmit driver circuit (325) and a circuit reference potential (GND), an output resistance of the output driver circuit in response to a second variable resistance control signal (P4).

In some implementations, the method may further include providing a resistive terminator network (335) connected between the pair of electrical nodes and operable, in response to the receive mode, to close a first switch (SW4) and a second switch (SW5) to make electrical connections from a common mode node (410) to each of the nodes in the pair of electrical nodes. Each of the made connections being though a resistance (R7, R8) may be sized to substantially match a common mode impedance characteristic. The resistive terminator network (335) may be further operable, in response to the transmit mode, to open the first switch (SW4) and the second switch (SW5). The common mode node (410) may be driven to a predetermined regulated voltage.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 8:
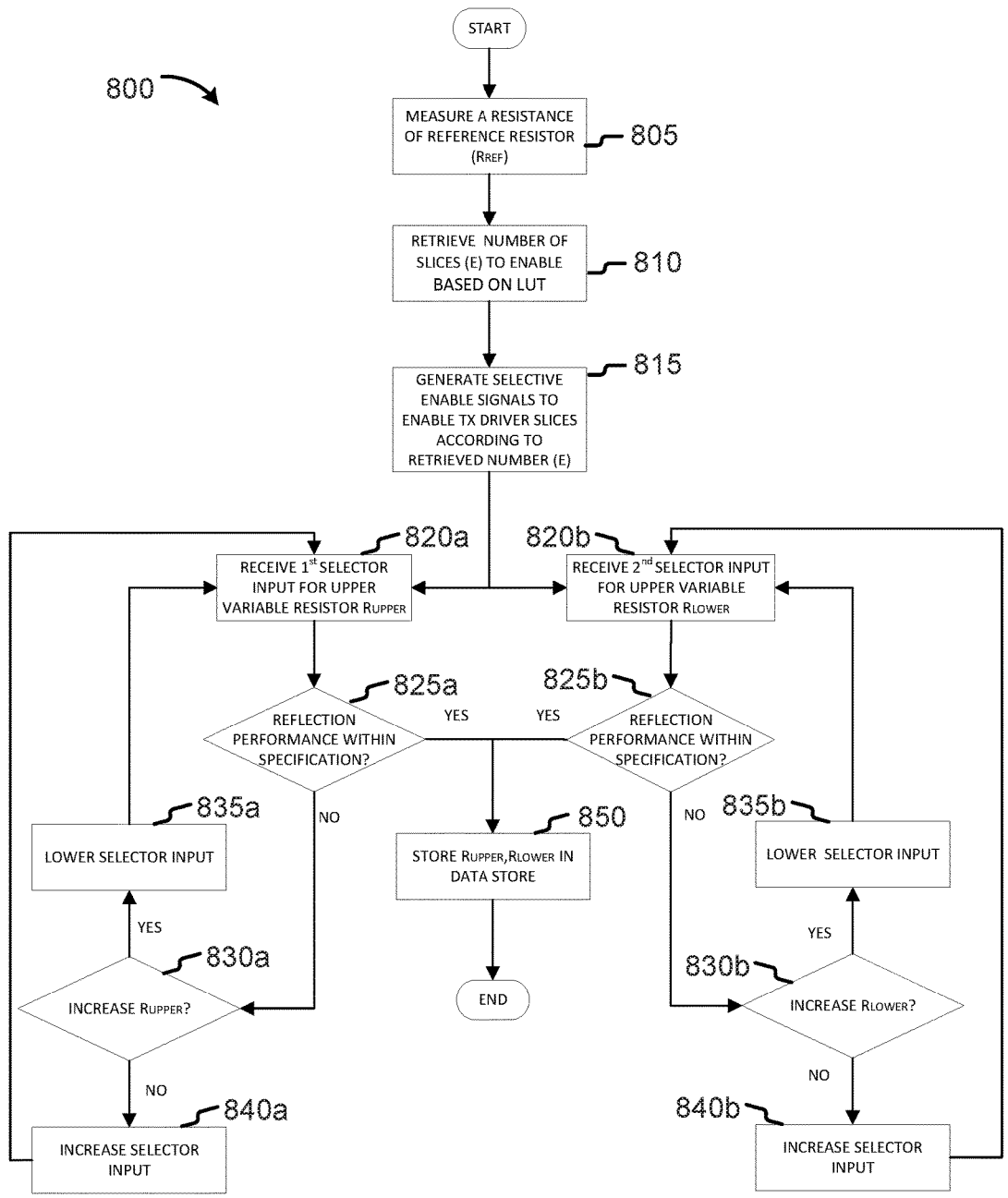
FIG. 8 depicts an exemplary process for coarse and fine control of a programmable resistance for a TX output driver.
Figure 9:
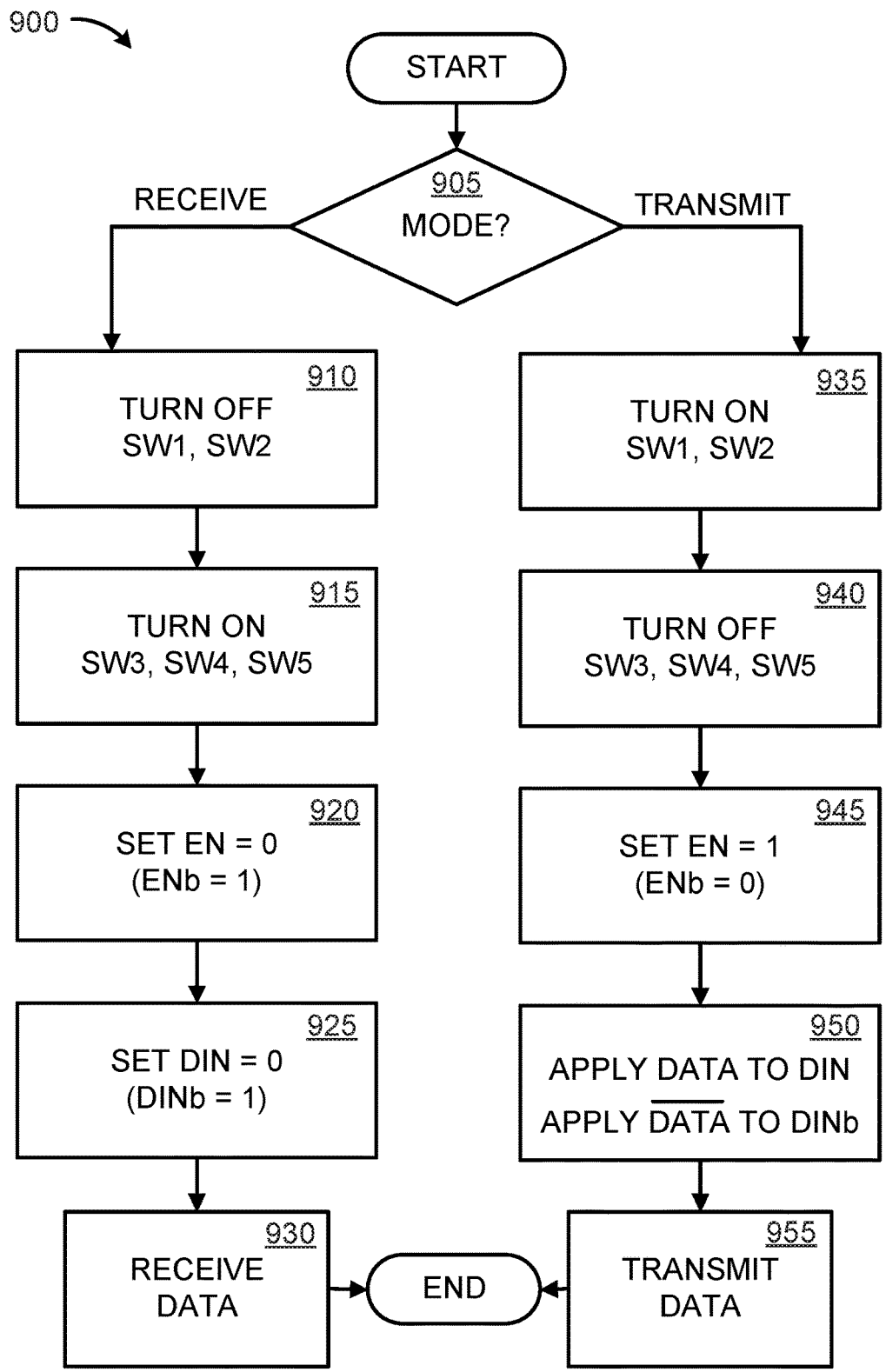
FIG. 9 depicts an exemplary flowchart of a bidirectional port control method.

To aid understanding, this document is organized as follows. First, an exemplary programmable integrated circuit (IC) is briefly introduced with reference to FIG. 1. Second, with reference to FIG. 2, the discussion turns to an illustration of an exemplary application. Next, with reference to FIG. 3 an exemplary embodiment including the major functional blocks of a unified I/O circuit is presented. Next, with reference to FIGS. 4-7, each of the major functional blocks is illustrated in further detail. Finally, FIGS. 8-9 present exemplary control processes for embodiments of a bidirectional port.

Figure 1:
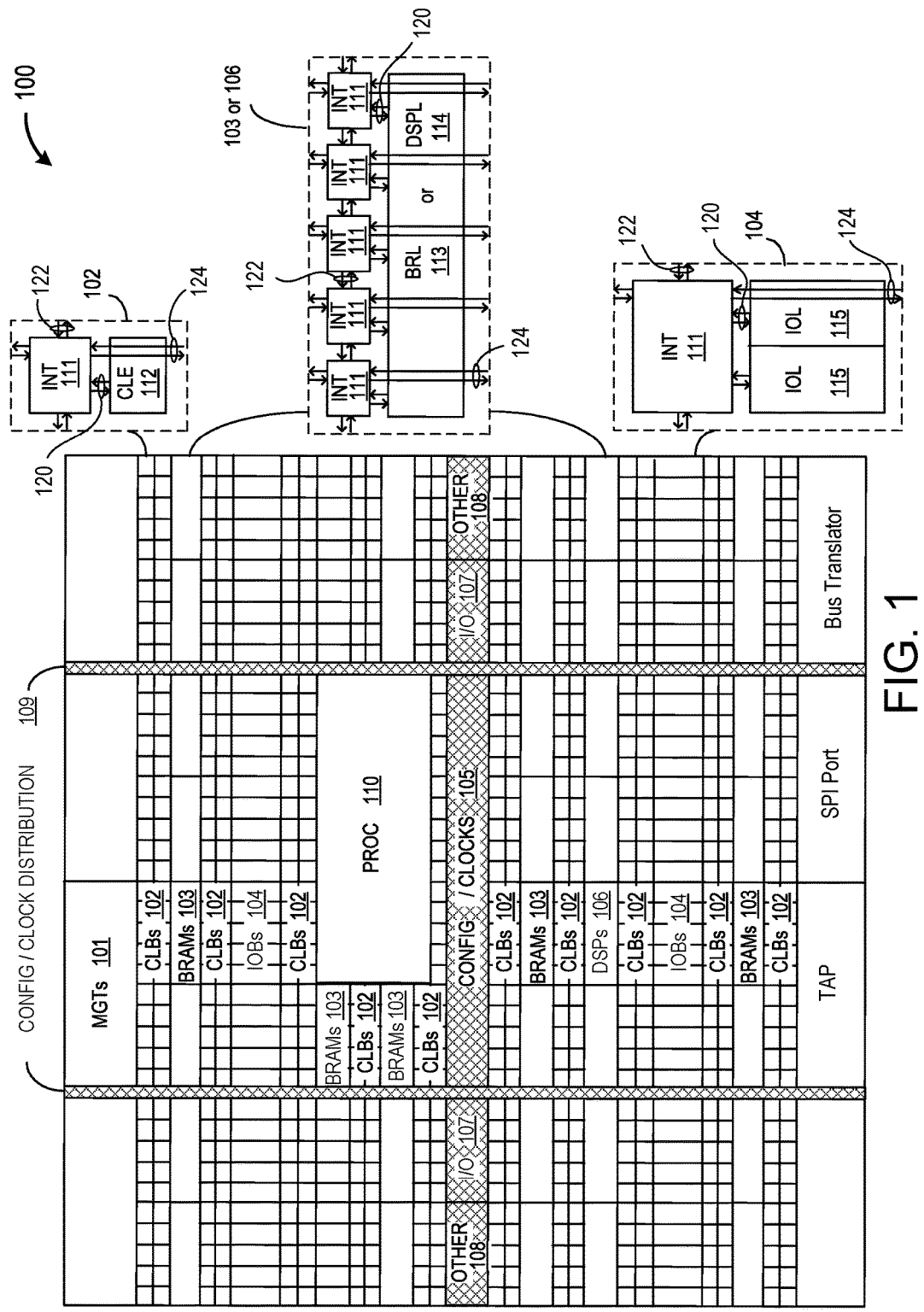
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP block 106 (which may be referred to as a tile) may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Some programmable ICs utilizing the architecture illustrated in FIG. 1 may include I/O circuits that may share I/O pins and/or bumps. In various examples, the I/O circuits may include one or more transmit drivers (TX drivers) and one or more receive buffers (RX buffers). For flexibility in receiving data conforming to multiple I/O standards, the I/O circuits may include a configurable termination network (TERM block). The TX driver, RX buffer and/or TERM block may be advantageously configured on various FPGAs. The FPGAs may employ thin-oxide technology in one or more locations.

Figure 2:
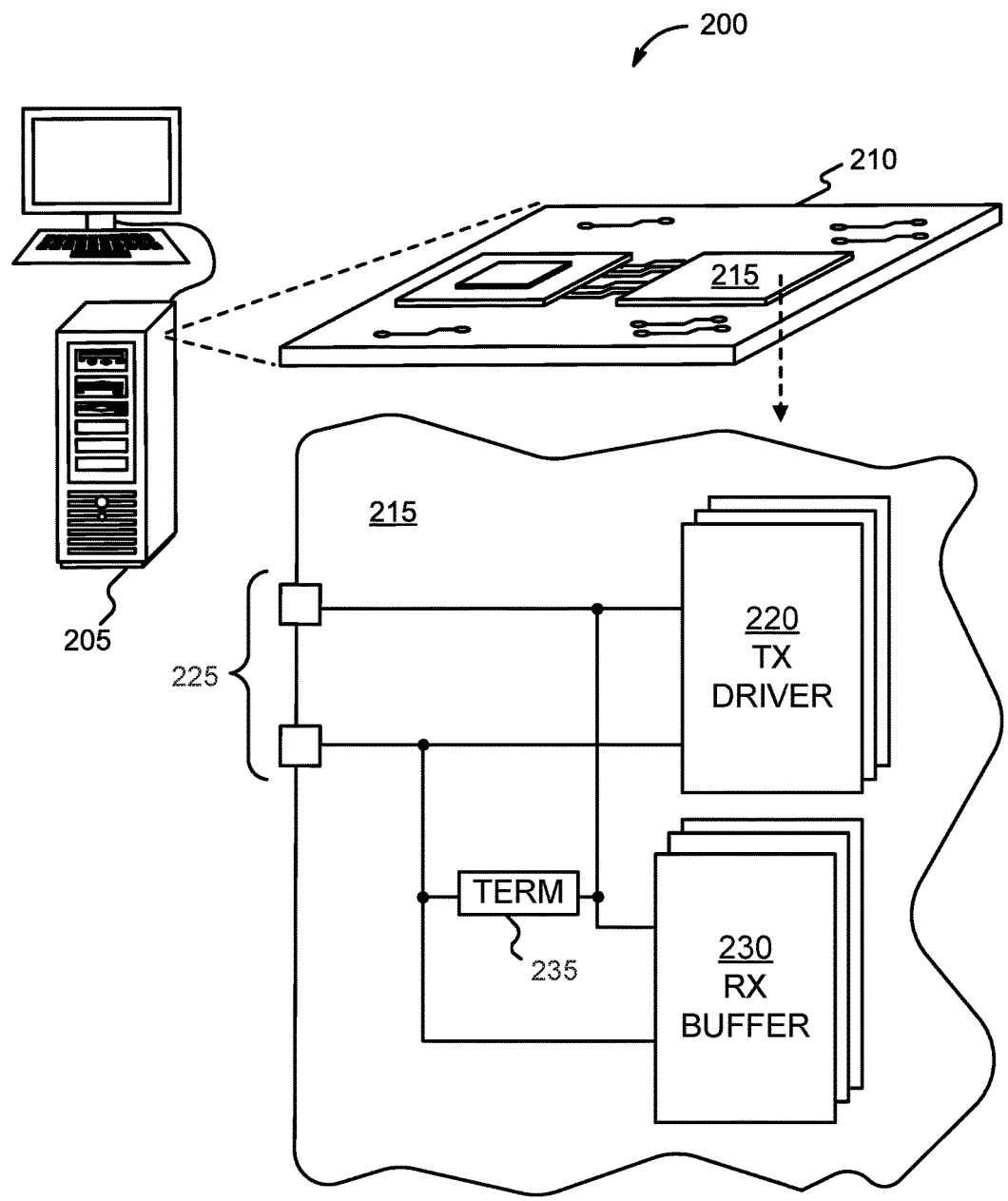
FIG. 2 depicts an exemplary unified low power bidirectional port implemented in a high-speed digital computing system.

FIG. 2 depicts an exemplary unified low power bidirectional port implemented in a high-speed digital computing system. A high-speed digital computing system 200 is exploded pictorially to varying levels of detail. The high-speed digital computing system 200 includes a server 205. The server 205 includes multiple interconnected circuit boards, one of which is a serializer/deserializer (SERDES) card 210. The SERDES card 210 includes a low-voltage core device 215. The core device 215 may be fabricated with thin-oxide technology. The core device 215 includes a data transmitter driver (TX driver) 220. The TX driver 220 is coupled to and may transmit data to a set of differential input/output pins (I/O pins) 225. In various implementations, the core device 215 may receive differential data on the I/O pins 225. The I/O pins 225 are coupled to a receive buffer (RX buffer) 230. The RX buffer 230 is coupled to and preceded by a resistive termination network (TERM) 235. The resistive termination network 235 may provide a differential and common mode termination resistance to, for example, mitigate signal reflection losses such that various high-speed signals may be received by the RX buffer 230 with substantially high data integrity. When coupled to a single set of pins or bumps on, for example, various ICs, the TX driver 220, the RX buffer 230 and the resistive termination network 235 may form a unified bidirectional port.

Figure 3:
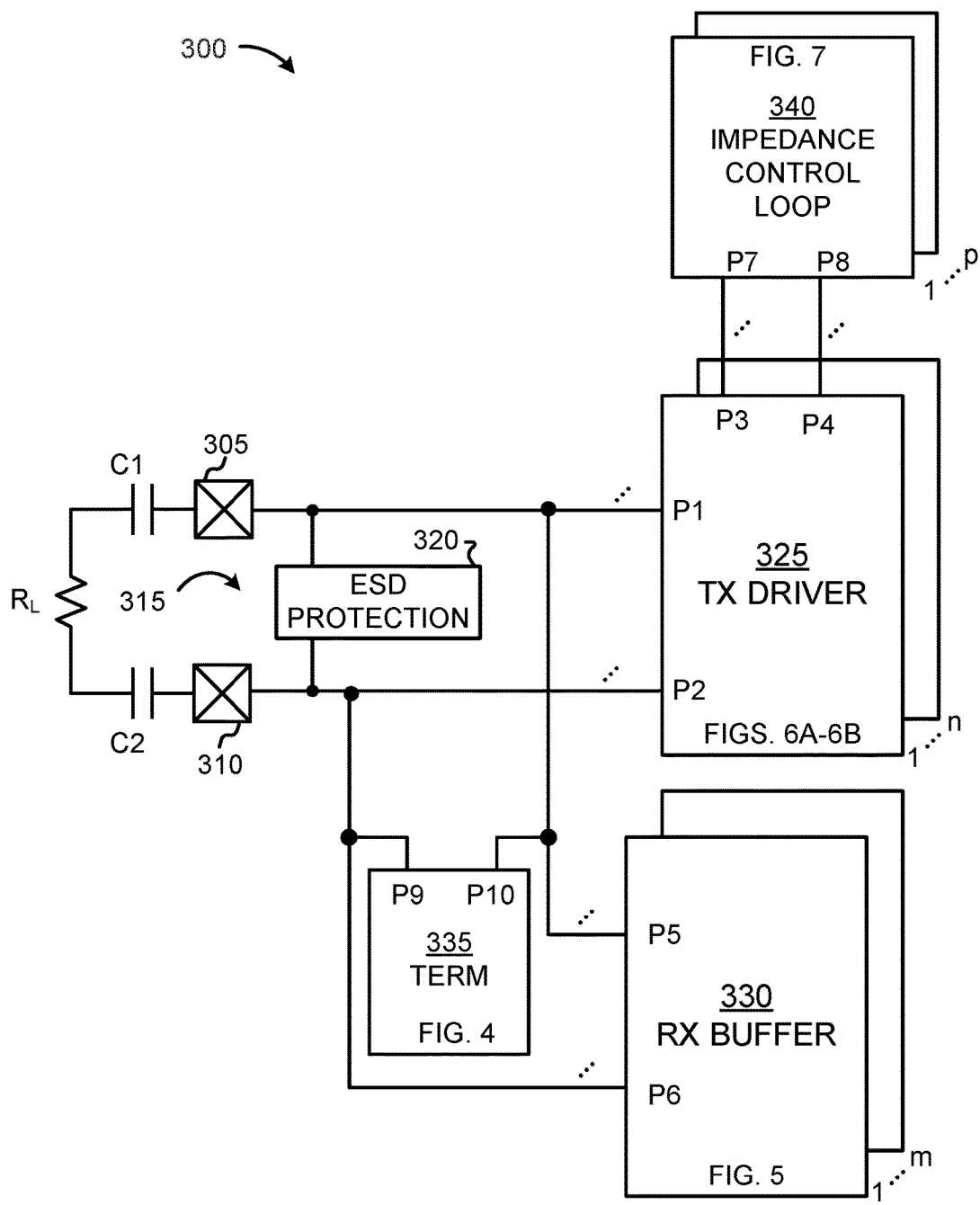
FIG. 3 depicts a block diagram of an exemplary unified bidirectional port.

FIG. 3 depicts a block diagram of an exemplary unified bidirectional port. In the depicted example, a unified bidirectional port 300 includes a positive I/O pin 305 and a negative I/O pin 310. The pins 305 and 310 are the interface for a differential port 315. The differential port 315 is coupled to an electrostatic discharge (ESD) protection circuit 320. The ESD protection circuit 320 may substantially mitigate damaging effects of ESD to the differential port 315 and all downstream circuits. The ESD protection circuit 320 may be formed of protection diodes (e.g., ultrafast rectifiers, signal diodes, Zener diodes, metal oxide varistors (MOVs)). The differential port 315 is coupled to a voltage-mode TX driver circuit 325 having n selectively enabled parallel slices, to an RX buffer circuit 330 having m selectively enabled parallel slices, and to a resistive terminator network (TERM) 335. The output impedance of each slice of the TX driver circuit 325 may be programmable by an impedance control loop circuit 340 having p selectively enabled parallel slices.

In some embodiments, p may be equal to 1 and n may be greater than p (e.g., p may be, for example, up to at least about 128 slices) such that a single impedance control loop circuit 340 is operatively coupled to p selectively enabled slices of the TX driver circuit 325, each slice of which may be configured to adjust an output impedance in response to control signals from the impedance control loop circuit 340.

In some embodiments, p may be equal to n such that each selectively enabled slice of the impedance control loop circuit 340 is operatively coupled to at least one corresponding slice of the selectively enabled slices of the TX driver circuit 325. Accordingly, each slice of the TX driver circuit 325 may be configured to independently adjust an output impedance in response to control signals supplied from the impedance control loop circuit 340.

As depicted, the differential port 315 is coupled to an exemplary external load impedance network. The load impedance network includes a load resistor RL in series with capacitor C1 and capacitor C2, and may be considered an electrical model representation of a load circuit driven by the TX driver circuit 325 in a transmit mode, or from which the RX buffer circuit 330 receives an incoming signal in a receive mode.

Figure 4:
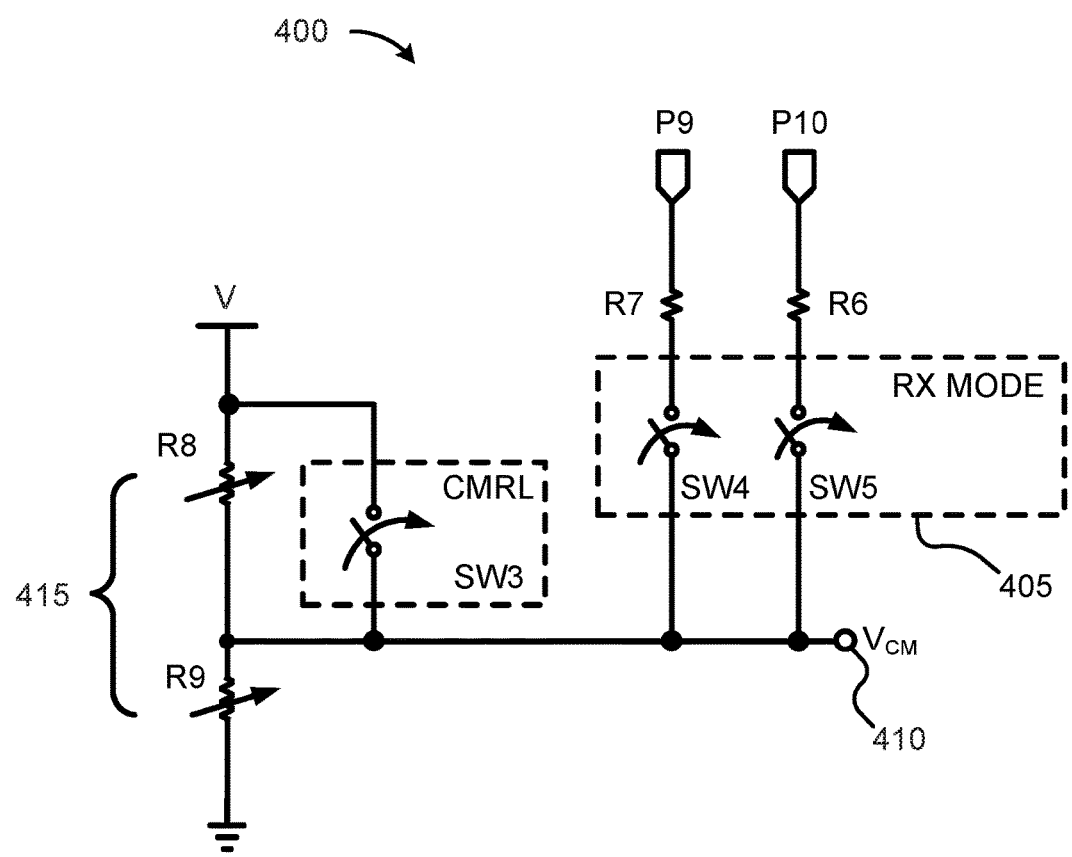
FIG. 4 depicts an exemplary resistive terminator network.

Examples of resistive terminator networks 335 that may be suitable for some embodiments are described, for example, with reference to FIG. 4. Examples of RX buffer circuits 330 that may be suitable for some embodiments are described, for example, with reference to FIG. 5. Examples of TX driver circuits 325 that may be suitable for some embodiments are described, for example, with reference to FIGS. 6A-6B. Examples of impedance control loops 340 that may be suitable for some embodiments are described, for example, with reference to FIG. 7.

The RX buffer circuit 330, the TX driver circuits 325 and the impedance control loops 340 are depicted with one or more parallel slices. As depicted, the TX driver circuit 325 may include n independently enabled parallel slices, the RX buffer circuit 330 may include m independently enabled parallel slices, and the Impedance Control Loop circuit 340 may include up to p independently enabled parallel slices. Various components within these circuits 330, 325 and 340 may be adjusted by enabling or disabling the components on one or more of the slices to customize, calibrate and/or substantially increase the precision and/or capacity of various circuit electrical parameters. For example, the output impedance of the TX driver circuit 325 may be adjusted by enabling or disabling parallel slices, which may increase the precision and/or optimize value of a target termination resistance to substantially match, for example, the transmission line impedance of the circuit to which the RX buffer circuit 330 is operably connected and from which it receives the incoming signal. Some embodiments may advantageously facilitate selection of a desired number of slices of the TX driver circuit 325 to achieve the desired electrical performance characteristics, for example, to minimize impedance mismatches, reduce reflection losses, and thereby enhance bandwidth and signal integrity.

As an aid in explaining the relationships of the parts as described with reference to FIGS. 4-7, the following terminals are connected: the I/O pins 305, 310 couple to terminals P1, P2 of the TX driver circuit 325, to terminals P5, P6 of the RX buffer circuit 330, and to terminals P9, P10 of the resistive terminator network (TERM) 335. Also, the terminals P3, P4 of the TX driver circuit 325 couple to terminals P7, P8 of the Impedance Control Loop circuit 340.

FIG. 4 depicts an exemplary resistive terminator network. A resistive terminator network 400 includes an RX MODE switch 405. The RX mode switch 405 includes a switch SW4. The switch SW4 is coupled on a first terminal to a second terminal of a resistor R7. A first terminal of the resistor R7 is coupled to a negative I/O terminal P9. As depicted in FIG. 3, the resistive terminator network 335 includes the exemplary connection to the negative I/O terminal P9. In an illustrative example, the resistance of R6 and R7 may each be 50 ohms, which may advantageously combine to form a 100-ohm differential resistance.

The RX mode switch 405 includes a switch SW5. The switch SW5 is coupled on a first terminal to a second terminal of a resistor R6. A first terminal of the resistor R6 is coupled to a positive I/O terminal P10. As depicted in FIG. 3, the resistive terminator network 335 includes the exemplary connection to the positive I/O terminal P10.

A second terminal of switch SW4 is coupled to a second terminal of the switch SW5. This junction of switch SW4 and switch SW5 forms a common mode node $V_{CM}$ 410. The common mode node $V_{CM}$ 410 is coupled to a resistor divider 415 formed of a variable resistor R8 on an upper leg, and of a variable resistor R9 on a lower leg. The common mode node $V_{CM}$ 410 is coupled to a second terminal of variable resistor R8 and to a first terminal of variable resistor R9. Variable resistor R8 is coupled on a first terminal to a supply voltage V.

Figure 6A:
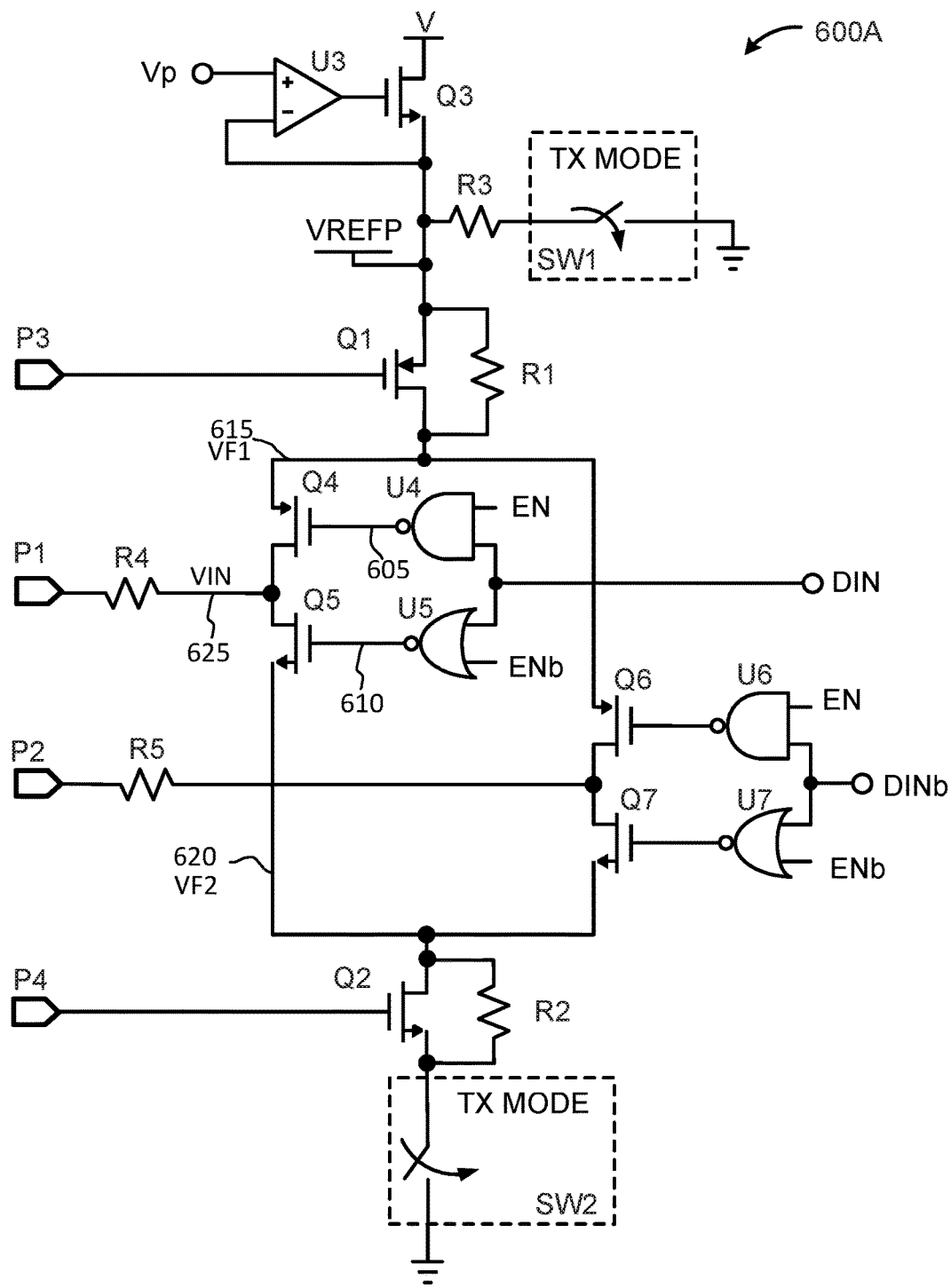
FIG. 6A depicts an exemplary TX driver circuit.

In some examples, the supply voltage V may be AVCC, or a predetermined voltage substantially equal to a common mode voltage suitable for the deployed circuit application. With reference to FIG. 6A, the supply voltage V may, in some embodiments, be derived as a function of Vrefp, by way of example and not limitation, using a unity gain buffer stage or a non-inverting gain stage. In some examples, the supply voltage V may be programmable, which may advantageously give user adjustable control over selection of a bias voltage for the Vcm 410.

Variable resistor R9 is coupled on a second terminal to a circuit reference (e.g., ground). A common mode reflection loss switch (CMRL switch) SW3 is coupled to the common mode node $V_{CM}$ 410 on a second terminal and to the supply voltage V on a first terminal.

Operating in a receive mode, the RX MODE switch 405 closes, closing both switch SW4 and SW5, which connects two differential termination resistors R6 and R7 across the terminals P9 and P10 of the resistive terminator network 400. In various applications, differential termination resistors R6 and R7 may be selected to substantially mitigate signal reflections. The resistive terminator network 400 may selectively determine a common mode voltage on the common mode node $V_{CM}$ 410 of a differential signal applied across the terminal P9 and P10. When the CMRL switch SW3 is activated (e.g., closed), the common mode voltage $V_{CM}$ may be determined by the supply voltage V. When the CMRL switch SW3 is deactivated (e.g., opened), the common mode voltage $V_{CM}$ may be determined by the low resistance resistor divider 415 formed of variable resistors R8 and R9 between the supply voltage V and the circuit reference. The resistor divider 415 formed of variable resistors R8 and R9 may advantageously improve common mode return loss for an RX buffer circuit, for example, the RX buffer circuit 330.

In a transmit mode, the RX MODE switch 405 opens, opening both switches SW4 and SW5, which disconnects the path of the two differential termination resistors R6 and R7 across the terminals P9 and P10 of the resistive terminator network 400. The opening of the RX MODE switch 405 may advantageously disconnect the entire resistive terminator network 400 from a differential port, for example, the differential port 315. Switch SW3 is disconnected from the differential port in transmit mode, since switches SW4 and SW5 are open. The state of SW3 does not affect functionality in transmit mode. Switch SW3 may be opened or closed in transmit mode. Opening SW3 in transmit mode may, in some implementations, advantageously reduce current drawn from the power supply V.

Figure 5:
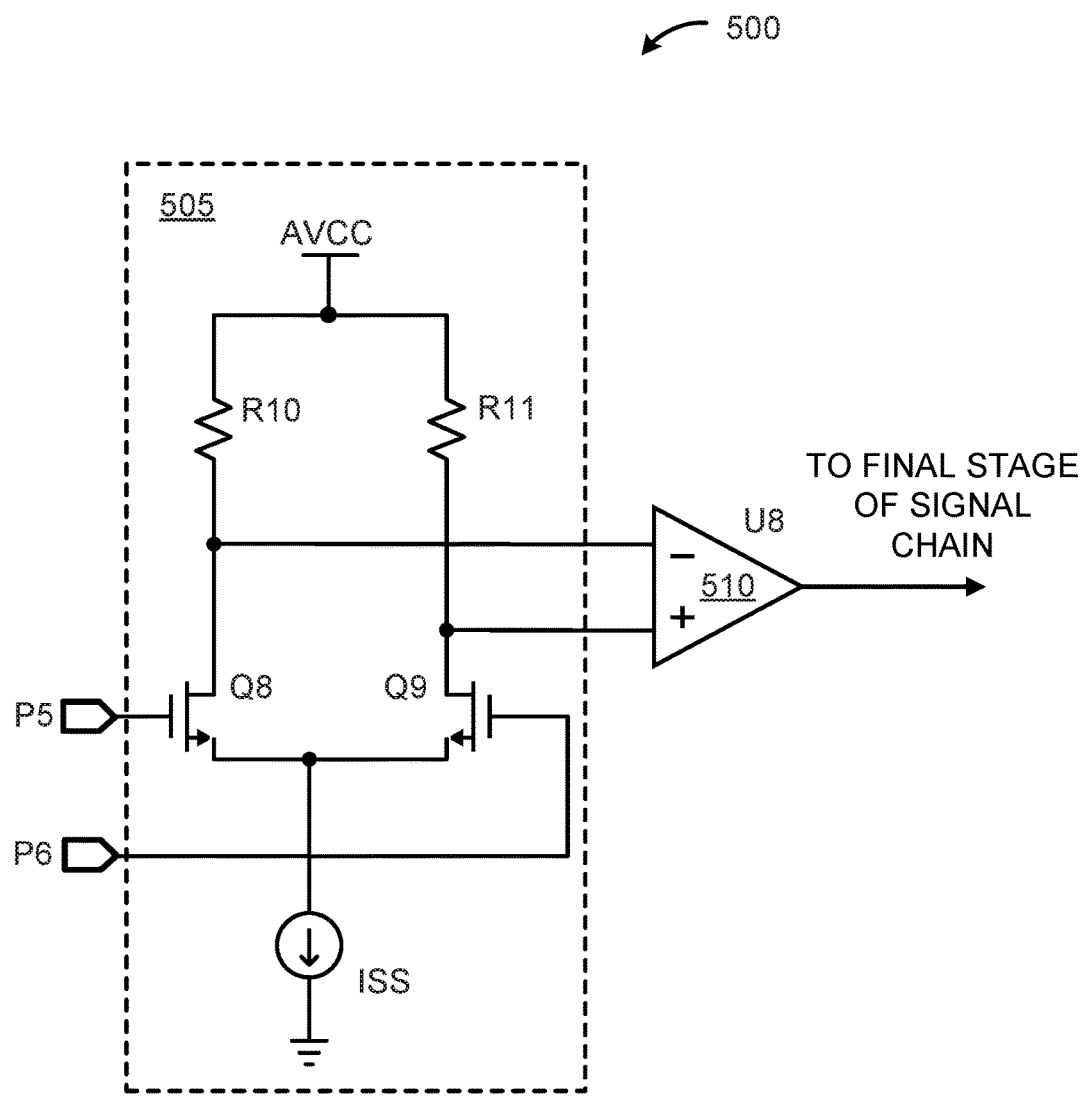
FIG. 5 depicts an exemplary RX buffer circuit.

FIG. 5 depicts an exemplary RX buffer circuit. An RX buffer circuit 500 includes a positive input terminal P5 and a negative input terminal P6. The positive and negative input terminals P5 and P6 are coupled to the inputs of an operational transconductance amplifier (OTA) 505. The OTA 505 is coupled on an output to an input of a current mode logic (CML) to CMOS stage 510. The CML to CMOS stage 510 sends out signals to final receiver stages (e.g., phase locked loop (PLL)).

In some implementations, the RX buffer circuit 500 may employ thick-oxide transistors while other circuits, such as the TX driver circuits 325, may employ thin oxide construction. Thick oxide construction may advantageously provide voltage stress to permit compatibility with signals sourced by higher voltage sources (e.g., 1.4V).

In some implementations, the RX buffer circuit 500 may receive a digital signal, which may represent, for example, a clock signal or a data signal. In some examples, the received signal may be a differential voltage format in which the voltage levels presented to P5 and P6 are substantially inversely related. In some embodiments, the received signal may be single ended, using only one of the input terminals P5 or P6 for active transitions, for example, while the other (inactive) input terminal may be substantially static at or about a predetermined voltage (e.g., 0, AVCC/2, AVCC, external supplied rail voltage). In some implementations, the received signal may be analog format, such as from a sensor (e.g., linear or nonlinear output, alarm output) wherein the received signal may be buffered, for example, by the OTA 505 and processed by an analog signal processing circuit (e.g., filter) and sampled and converted to a digital format, for example, such as with a slicer circuit (not shown).

FIG. 6A depicts an exemplary TX driver circuit. A TX driver circuit 600A may be configured for voltage mode logic. Implementation of voltage mode logic may achieve 50% or more power reduction compared to current mode logic (CML), for example. In FIG. 6A, the depicted embodiment is a representative embodiment of a single selectively-enabled slice of an exemplary TX driver circuit, such as one of the n parallel slices of the TX driver circuit 325 of FIG. 3. In this example, the TX driver circuit 600A includes an op amp U3 coupled on a noninverting input to an analog control signal Vp. The analog control signal Vp may be operable to set an upper bound of the voltage swing of the output of the TX driver circuit 600A. The op amp U3 is coupled on an output to a gate of an n-channel transistor Q3. The transistor Q3 is coupled on an output source to an inverting input on the op amp U3 in a buffered unity follower configuration so as to regulate a voltage VREFP at the source of the transistor Q3. In normal operation, VREFP tracks the voltage of Vp. The transistor Q3 is coupled on an input drain to a supply voltage V. The transistor Q3 is coupled on an output source to a first terminal of a resistor R3. The resistor R3 is coupled on a second terminal to an input of a TX mode switch SW1. The TX mode switch SW1 is coupled on an output to a circuit reference node.

The analog control signal Vp in combination with the op amp U3, the transistor Q3, the resistor R3 and the TX mode switch SW1 may form a programmable voltage regulator. The programmable voltage regulator may produce and regulate a programmable reference voltage supply VREFP on the output source of the transistor Q3. VREFP may be regulated to substantially match programmable reference voltage of Vp. Vp may be generated to be any desired voltage to establish an upper bound at an output of the TX driver circuits.

The TX driver circuit 600A further includes a first output driver circuit and a second output driver circuit, each of which is driven, respectively, by a first programmable pre-driver circuit and a second programmable pre-driver circuit. The first and second output driver circuits connect in parallel between a node 615 (VF1) that establishes the upper bound of the voltage swing and a node 620 (VF2) that establishes the lower bound of the voltage swing.

The first and second output driver circuits connect on a high voltage side to VREFP through a first programmable resistance circuit. In the TX mode of operation, the first and second output driver circuits connect on a low voltage side to circuit reference (e.g., ground reference) through a second programmable resistance circuit. The first and second programmable resistance circuits may each form a programmable resistor having a resistance value that is responsive to the impedance control loop signals P3, P4, respectively, from a corresponding slice of an impedance control loop, such as one of the n slices of the impedance control loop circuit 340 of FIG. 3, examples of which are described in further detail with reference to FIG. 7.

The first programmable resistance circuit includes a p channel transistor Q1 and a resistor R1 connected in parallel between the drain and source of Q1. The transistor Q1 is coupled on its source to the VREFP and on its drain to the node 615 (VF1). The gate input of transistor Q1 is coupled to the input terminal P3. The second programmable resistance circuit includes an n channel transistor Q2 and a resistor R2 connected in parallel between the drain and source of Q2. The transistor Q2 is coupled on its source (through a mode responsive switch SW2, in this example) to the circuit reference potential and on its drain to the node 620 (VF2). The gate input of transistor Q2 is coupled to the input terminal P4.

The first output driver circuit is operably coupled to output a driven signal to the first output terminal P1 via a series resistor R4. The resistor R4 is coupled between P1 and an output node that connects to a drain output of a p channel transistor Q4 and a drain output of an n channel transistor Q5. A source of Q4 connects to the node 615 VF1, and a source of Q5 connects to the node 620 VF2.

The second output driver circuit is operably coupled to output a driven signal to the second output terminal P2 via a series resistor R5. The resistor R5 is coupled between P2 and an output node that connects to a drain output of a p channel transistor Q6 and a drain output of an n channel transistor Q7. A source of Q6 connects to the node 615 VF1, and a source of Q7 connects to the node 620 VF2.

The first and second programmable pre-driver circuits may each be operable, in a receive (RX) mode, to apply a protective bias voltage to the control terminals (gates) of each of the transistors in the respective output driver circuits to protect the output driver circuits from voltage stress that may be imparted by a received signal that has a higher drive voltage than the safe operating specifications of the TX driver circuit 600A. In a transmit (TX) mode, the programmable pre-driver circuits may also be selectively enabled on a slice-by-slice basis. Enabled slices are configured to pass data (DIN, DINb) signals through the programmable pre-driver circuits to the respective output driver circuits for transmission as an output signal. Slices that are not selectively enabled are configured to block data (DIN, DINb) signals from passing through the programmable pre-driver circuits to the respective output driver circuits. For example, a non-selected TX slice may be on standby in a high-impedance state.

In the depicted example, the first programmable pre-driver circuit includes a NAND gate U4 and a NOR gate U5. The NAND gate U4 operably couples a gate of Q4. The NOR gate U5 operably couples a gate of Q5. U4 generates a gate control signal 605 as a NAND function of a slice selecting enable (EN) signal and a data (DIN) signal. U5 generates a gate control signal 610 as a NOR function of a complement of the slice selecting enable (ENb) signal and the data (DIN) signal.

The second programmable pre-driver circuit includes a NAND gate U6 and a NOR gate U7. The NAND gate U6 operably couples a gate of Q6. The NOR gate U7 operably couples a gate of Q7. U6 generates a gate control signal as a NAND function of a slice selecting enable (EN) signal and a complement of the data (DINb) signal. U7 generates a gate control signal as a NOR function of a complement of the slice selecting enable (ENb) signal and a complement of the data (DINb) signal.

The source output of the transistor Q2 is coupled to an input of a TX mode switch SW2. The TX mode switch SW2 is coupled between the second programmable resistance circuit and the voltage reference node. In TX mode, the SW1, SW2 may be both closed, which may establish a stable voltage level for each of the upper bound (VREFP) and lower bound (voltage reference node, or circuit "ground" reference potential) for the voltage swing output by the TX driver circuit 600A onto R4 and R5. In some implementations, for example, the SW1, SW2 may both be closed during TX mode if the slice is selectively enabled for transmission of DIN; however, some examples may be configured to maintain SW1, SW2 open during TX mode for slices that are not selectively enabled (e.g., in high-impedance state). Closing SW1, SW2 only on selectively enabled slices may advantageously reduce stray capacitance, for example.

During RX mode operation, a controller (not shown) may open SW1, SW2, which causes the sources of the TX driver transistors Q4, Q5, Q6 and Q7 to float. This prevents current flow back-feeding through the TX driver circuits during RX mode operation, and may protect against stresses associated with incoming received signals that may exceed the operating voltage (e.g., 0.8V, core voltage) of thin-oxide TX driver circuits, for example.

In a transmit mode, with the switches SW1 and SW2 closed, the output swing of the TX driver, for example, the voltage swing between the first output terminal P1 and the second output terminal P2 of the TX driver circuit 600A, may be controlled by the analog control voltage Vp. The analog control voltage Vp may be controlled by various processors. For example, the analog control voltage Vp may be controlled by a processor and a digital to analog converter (DAC) implementation in FPGA fabric. In some implementations, the analog control voltage Vp may be controlled by an analog input voltage, for example, hardwired to the IC. In various implementations, the analog control voltage Vp may be programmable, for example, in various hardware description languages (HDLs). The output voltage swing may be programmable, producing a peak-to-peak output voltage of about 100 mV, 200 mV, 300 mV, 400 mV, 500 mV, 600 mV, 700 mV, 800 mV, 900 mV or up to about 1000 mV or more.

In some examples, the programmable reference voltage supply VREFP may supply the circuit which forms the output swing of the TX driver circuit 600A. Accordingly, the output swing of the TX driver circuit 600A may be programmable. For example, programmable reference voltage supply VREFP may be adjusted programmatically by adjusting the analog control voltage Vp. In various implementations, the programmable reference voltage supply VREFP may be adjusted by statically shunting some of the slices of the TX driver circuit 600A, which may achieve a programmable swing. In an illustrative example, VP, which may be the basis of the output voltage swing of the TX driver circuit 600A may be derived from selecting a tap from a voltage divider between the programmable reference voltage supply VREFP and ground.

Figure 6B:
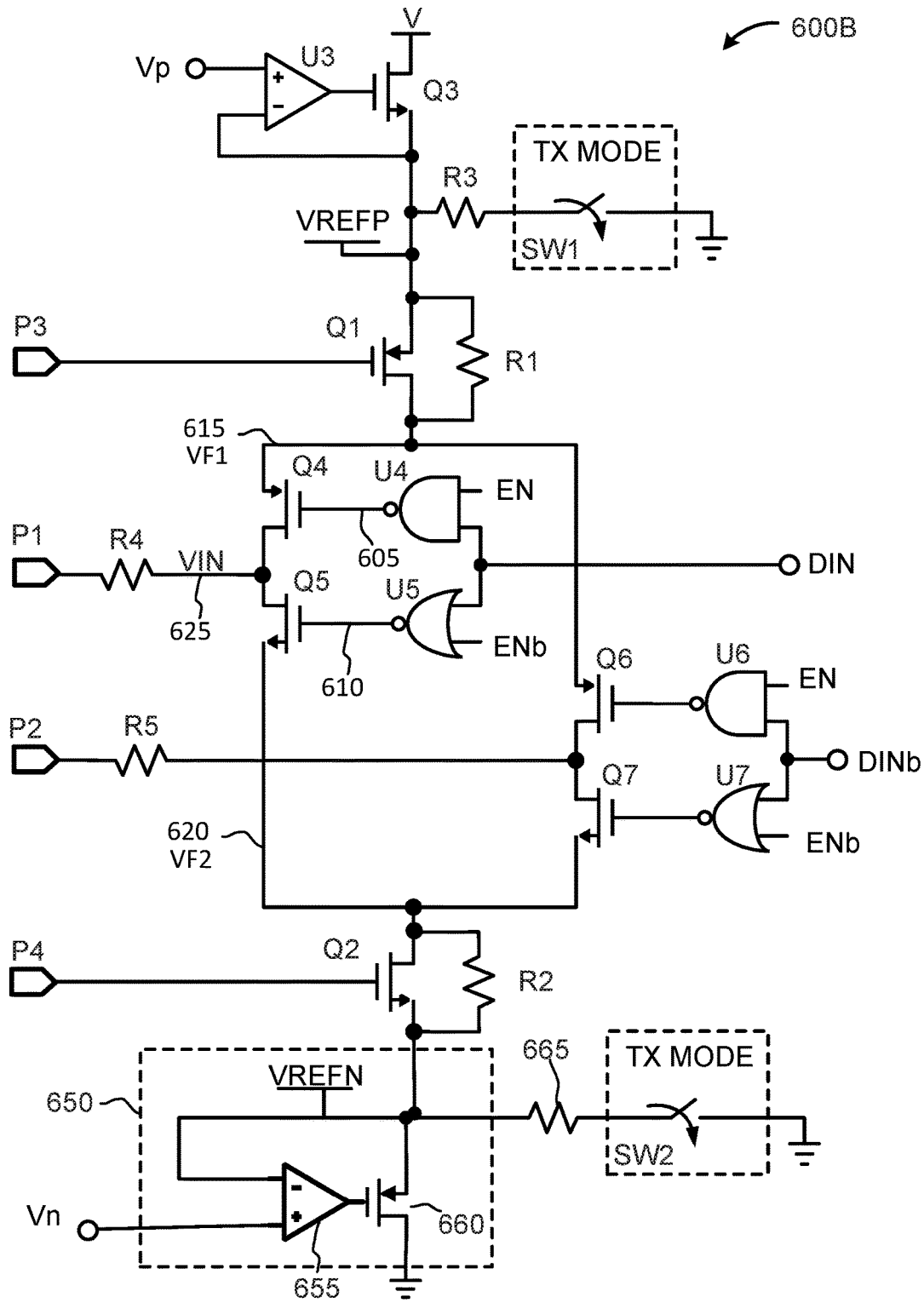
FIG. 6B depicts an exemplary TX driver circuit with programmable lower bound voltage swing.

FIG. 6B depicts an exemplary TX driver circuit with programmable lower bound voltage swing. In the depicted example, a single slice of a TX driver circuit 600B differs from the TX driver circuit 600A of FIG. 6A to the extent it has been modified between the second programmable resistor circuit of Q2, R2 and the reference potential node (e.g., circuit ground) to include a programmable voltage regulator 650. The modification of the depicted embodiment is configured to generate a user programmable voltage VREFN, which may provide, for example, a programmable lower bound for the voltage swing during TX mode operation.

The programmable voltage regulator 650 includes an op amp 655 and a p channel transistor 660. In combination with, a resistor 665 in series with the TX mode switch SW2, the programmable voltage regulator may be responsive to track an analog control signal Vn. The programmable voltage regulator 650 may produce and regulate a programmable reference voltage supply VREFN on the output source of the transistor 660. VREFN may be regulated to substantially match a programmable reference voltage of Vn. Vn may be generated (e.g., with a multiplexer, digital-to-analog converter) to be any desired voltage to establish a lower bound of the voltage swing at an output of the TX driver circuits.

Referring to embodiments described with reference to FIGS. 6A-6B, various embodiments may be configured to provide enhanced proactive protection against voltage stress induced by incoming signals generated, for example, by sources that may exceed safe operating margins of the TX driver circuits 325, for example. In various implementations, such proactive protection may advantageously enable higher speed performance using thin oxide devices, for example, by actively protecting the devices against exposure to voltage stresses imparted by signals induced on the bidirectional port. In some implementations, this may permit an FPGA or ASIC (or other integrated circuit type) constructed with a 0.8V thin oxide process, for example, to be directly compatible to be interfaced in a bidirectional port with a higher voltage device that outputs a 1.5 V voltage swing (e.g., combining common mode plus peak differential voltage). In some examples, a differential peak to peak voltage swing with an AC-coupled low voltage signal may be up to at least about 2.4 Vpp.

In a receive mode, when switch SW1 is opened, the source of Q4 may float to a voltage VF1 615. When switch SW2 is opened, the source of Q5 may float to a voltage VF2 620. Logic signals to the inputs of U4 and U5 are set to predetermined levels to produce a logic high VS (e.g., Vsupply) on the U4 output of the gate control signal 605 and to produce a logic high VS on the U5 output of the gate control signal 610. In various examples, VS may be a core voltage Vcore such as, for example, about 0.9V.

When an input signal enters P1 from an external source, the input voltage may appear on a common node VIN 625 formed from the common connection between the drain of Q4, the drain of Q5 and the second terminal of resistor R4. The voltages VS, VF1, VF2 and VIN produce the following differential voltages across transistors Q4 and Q5. Similarly, these differential voltages may appear across transistors Q6 and Q7.

$V_{GD(Q4)}=V_{GD(Q5)}=VIN-VS$ $V_{GS(Q4)}=VS-VF1$ $V_{DS(Q4)}=VIN-VF1$ $V_{GS(Q5)}=VS-VF2$ $V_{DS(Q5)}=VIN-VF2$

Various embodiments may achieve one or more advantages. For example, some embodiments may achieve voltages on various transistor terminals that may produce differential voltages that may maintain device voltage stresses within safe operating specifications to substantially avoid or eliminate degradation and/or stress of various TX driver circuits 600A.

In an illustrative example, a unified bidirectional port, such as the unified bidirectional port 300 (FIG. 3), is configured for receive mode, such that switches SW1 and SW2 are opened. A signal is received by the differential port 315 (FIG. 3). The signal may be received by the RX buffer circuit 330 (FIG. 3). Since the TX driver circuit 325 (FIG. 3) is coupled to the differential port 315, it also experiences the voltage present on the differential port 315. Specifically, the voltages on the differential port 315 are present at P1 and P2 (FIGS. 3, 6A). Protection from the voltage stresses present at P1 and P2 may be handled in a similar manner. For example, with reference to FIG. 6B, P1 may experience a voltage of 1.4V from the signal present on the differential port 315. This 1.4V may be present at common node VIN 625. The voltages VF1 615 and VF2 620 may float to, for example, 0.8V. For a core supply voltage of VS=0.9V, the differential voltages across the transistors Q4 and Q5 may be for example:

$V_{GD(Q4)}=V_{GD(Q5)}=VIN-VS=1.4V-0.9V=0.5V$ $V_{GS(Q4)}=VS-VF1=0.9V-0.8V=0.1V$ $V_{DS(Q4)}=VIN-VF1=1.4V-0.8V=0.6V$ $V_{GS(Q5)}=VS-VF2=0.9V-0.8V=0.1V$ $V_{DS(Q5)}=VIN-VF2=1.4V-0.8V=0.6V$

Various IC fabrication processes may have a voltage application limit. For example, transistors fabricated with thin-oxide technology may be stressed and/or damaged by voltages over 1 V. In the example discussed, each of the voltages applied across the transistors is less than 1 V. In some embodiments, the voltages applied across the transistors may be a predetermined operating voltage supplied to the control terminal of each of the two or more transistors in the transmit driver circuit (325) that is, by way of example and not limitation, between about 0.6V and about 1.0V, such as between about 0.7V and about 0.95V, or between about 0.75V and about 0.85V.

In the discussed example of FIG. 6B, the transistors Q4 and Q5 may be protected from damage in a thin-oxide process. Accordingly, the TX driver circuit 325 (FIG. 3) may be protected from the voltage stresses from wide voltages swings during RX mode. The wide voltage swings may originate, for example, from external devices driving the unified bidirectional port 300 (FIG. 3).

Figure 7:
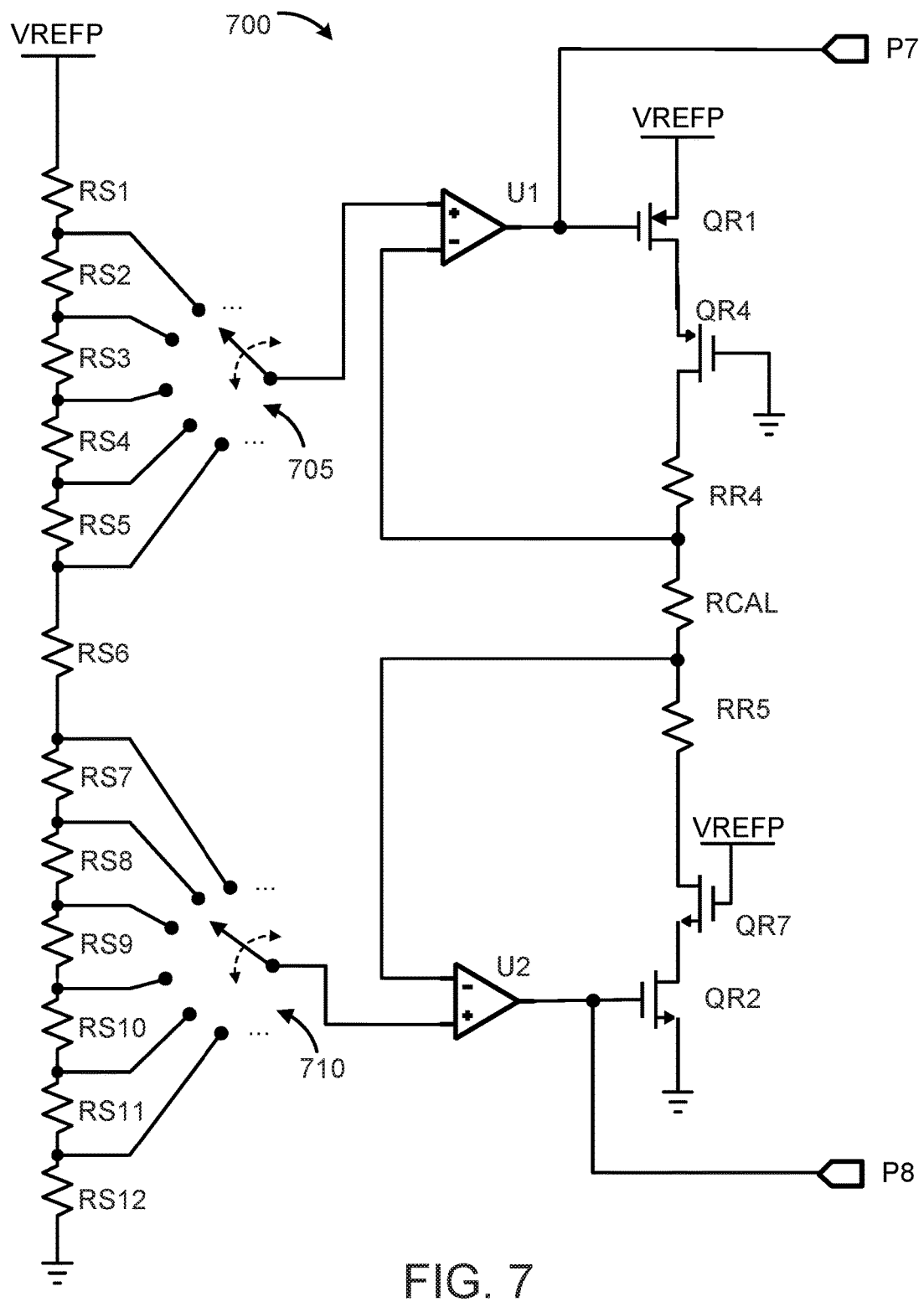
FIG. 7 depicts an exemplary impedance control loop.

FIG. 7 depicts an exemplary impedance control loop. An impedance control loop circuit 700 includes a resistor ladder made up of resistors RS1-RS12 in series connection between VREFP and circuit ground. In some embodiments, the resistor ladder could extend between VREFP and VREFN, an embodiment of which is further described with reference to FIG. 6B. One of a number of nodes between the resistors RS1-RS6 may be selectively coupled to an upper selector 705. One of a number of nodes between the resistors RS6-RS12 may be selectively coupled to a lower selector 710. A selector 705, 710 may include independently selectable switches, or, for example, an analog multiplexer.

A selected output of the upper selector 705 is coupled to a non-inverting input of an op amp U1. An output of the op amp U1 is coupled to a gate of a p channel transistor QR1 and, via P7, P3 to a gate of Q1. QR1 may be formed to be a substantial replica of Q1, such that the current established through QR1 may cause Q1 to operate with a similar linear resistance characteristic. Similarly, a selected output of the lower selector 710 is coupled to a non-inverting input of an op amp U2. An output of the op amp U2 is coupled to a gate of an n channel transistor QR2 and, via P8, P4 to a gate of Q2. QR2 may be formed to be a substantial replica of Q2, such that the current established through QR2 may cause Q2 to operate with a similar linear resistance characteristic. A current through QR1, QR2 may be established through a series connected arrangement of a p channel QR4, resistors RR4, RCAL, and RR5, and n-channel transistor QR7. A gate of QR4 is shown tied to circuit ground, and a gate of QR7 is shown as pulled up to VREFP. An inverting input of U1 is coupled to a node between RR4, RCAL, and an inverting input of U2 is coupled to a node between RCAL, RR5. The circuit may, in various embodiments, operate to establish a current through QR1, QR2 in response to a voltage difference between the selected voltage at the upper selector 705 and the selected voltage at the lower selector 710, where the current is set by that voltage difference applied across RCAL.

The impedance control loop circuit 700 may implement a "fine adjust" impedance control. The impedance control loop circuit 700 employs two closed control loops, one at each of the inverting inputs on the op amps U1 and U2. The closed control loops generate a control voltage at P7 to control Q1 (FIG. 6A) and a control voltage at P8 to control Q2 (FIG. 6A). The closed loops control the impedance looking into the TX driver circuit at P1 and P2 (FIGS. 3, 6A). In various examples, the impedance looking into the inputs P1 and P2 may represent termination resistances Rp and Rn, respectively. In some implementations, the impedance control loop circuit 700 may regulate the input impedance of the TX driver circuit 600A to meet a 50-ohm return loss specification, for example. In some implementations, a control processor may operate to select the positions of the selectors 705, 710 based on measured self-diagnostic performance characteristics.

The impedance control loop circuit 700 may provide a control voltage to the output terminal P7 (FIGS. 3, 7) on the impedance control loop circuit 700 to the input terminal P3 on the TX driver circuit 325 (FIGS. 3, 6A) to regulate the output impedance of the TX driver circuit 600A via Q1 (FIG. 6A). Similarly, the impedance control loop circuit 700 may provide a control voltage to the output terminal P8 (FIGS. 3, 7) on the impedance control loop circuit 700 to the input terminal P4 on the TX driver 325 circuit (FIGS. 3, 6A) to regulate the output impedance of the TX driver circuit 600A via Q2 (FIG. 6A).

In some implementations, the upper selector 705 may be configured such that the noninverting input of the op amp U1 may be coupled to about ¾ of the programmable reference voltage VREFP. Similarly, the lower selector 710 may be configured such that the noninverting input of the op amp U2 may be coupled to about ¼ of the programmable reference voltage VREFP. When RR4 and RR5 are each configured to ½ of the resistance of RCAL, this implementation may advantageously adjust the resistance of QR1 and QR2 and may adjust the resistance of the associated transistors Q1 and Q2 (FIG. 6A) such that the output impedance of the TX driver circuit 600A (FIG. 6A) may be controlled in response to the state of the selectors 705, 710.

In various implementations, a precision (e.g., about 1%, 0.5%, 0.2%, or about 0.1% tolerance) resistor may serve as a reference to set the coarse output impedance of a TX driver. In some examples, the reference resistor may be external to an FPGA or ASIC that embodies the bidirectional port. Some implementations may use a lookup table based on an external reference resistor to determine how many slices to enable. Selecting a number of slices to enable may provide a coarse adjustment to the programmable resistor. In some implementations, the number of enabled slices may vary. For example, the number of enabled slices may vary from 52 to 68 to track, for example, process-related variation in TX output resistance characteristics.

FIG. 8 depicts an exemplary process for coarse and fine control of a programmable resistance for a TX output driver. In the depicted example, a process flow 800 provides an exemplary automated self-calibrating sequence for establishing, by execution of a state machine or a program of instructions with a processor, an approximate (coarse) and then a finer adjustment to a TX driver output resistance. The automated process flow 800 includes determining a number of slices of the TX driver circuit 325 to enable, followed by a finer adjustment responsive to a programmable selection circuitry, such as the selectors 705, 710. A processor, such as a microprocessor or microcontroller, or a state machine, may be configured to execute the operations of the process flow 800, for example. Some of the operations may be executed by retrieving data and/or instructions that may be stored in a data store (e.g., memory space locations). Some operations may include storing determined parameter data values in a memory location (e.g., register) that may be in a data store internal or external to the IC that contains the bidirectional port.

To establish a coarse resistance value, the process flow 800 starts at 805 with determining a resistance measurement of a reference resistor (Rref), which may be located external to the IC that contains the bidirectional port 300. In various embodiments, the reference resistor may be a precision resistor. At 810, the process uses the Rref value to retrieve, from a predetermined look-up table, to determine a number (E) of slices to enable within the TX driver circuit 325. The look up table may provide a mapping of Rref value ranges to number of slices to enable in order to achieve a coarse, or approximate, output resistance for the TX driver circuits 325. At 815, the process generates the appropriate selective enable signals to cause E number of slices of the TX driver circuit 325 to be active for the transmission. With reference to the embodiment depicted in FIGS. 6A-6B, the enable signals for the depicted slice are EN, ENb.

To adjust the coarse resistance value to a finer tolerance, the process flow 800 may apply control signals to control the resistance of an element in series with the output driver transistors (e.g., Q1-Q4 of FIG. 6A). In an illustrative example, a fine-tuning adjustment may be made by controlling the first and second programmable resistance circuits via the respective gates of Q1, Q2 (FIGS. 6A-6B). These fine-tuning control signals may be generated, for example, by the impedance control loop circuit 700 of FIG. 7. An automatic process for adjusting the resistances of the E selectively enabled TX Driver circuits 325 includes receiving, at 820a, a first selector input for upper variable resistor Rupper. Initially, the first selector input (e.g., the upper selector 705) may be set to a predetermined default value (e.g., the node between RS1, RS2). In parallel, the automatic process for adjusting the resistances of the E selectively enabled TX Driver circuits 325 further includes receiving, at 820b, a second selector input for lower variable resistor Rlower. Initially, the second selector input (e.g., the lower selector 710) may be set to a predetermined default value (e.g., the node between RS11, RS12).

Upon receiving the first selector input at 820a, 825a determines whether reflection performance is within specification. If it is, then the Rupper value is stored in a data store at 850. If it is not, then a determination is made at 830a whether Rupper needs to increase. If Rupper needs to increase, then action is taken to lower the selector input (e.g., to a lower potential node in the resistor ladder RS1-RS5) at 835a, and then control returns to 820a. If Rupper needs to decrease, then action is taken to raise the selector input (e.g., to a higher potential node in the resistor ladder RS7-RS12) at 840a, and then control returns to 820a.

Upon receiving the second selector input at 820b, 825b determines whether reflection performance is within specification. If it is, then the Rlower value is stored in a data store at 850. If it is not, then a determination is made at 830b whether Rlower needs to increase. If Rlower needs to increase, then action is taken to lower the selector input (e.g., to a lower potential node in the resistor ladder RS1-RS5) at 835b, and then control returns to 820b. If Rlower needs to decrease, then action is taken to raise the selector input (e.g., to a higher potential node in the resistor ladder RS7-RS12) at 840b, and then control returns to 820b.

In some embodiments, the decision regarding performance at 825a, 825b may include, for example, assessing performance indirectly based on a bit error rate over a test period. Iterative adjustments may be used to determine whether, for example, lowering or increasing (e.g., 835a, 840a) makes the reflection performance, and thus bit error rate, better or worse.

FIG. 9 depicts an exemplary flowchart of a bidirectional port control method. A bidirectional port control method 900 for configuring a bidirectional port 300, according to various embodiments, for operation in either transmit mode or receive mode. The method 900 begins at decision block 905. At decision block 905, the method 900 determines a mode. If the mode is "receive," then the method 900 continues to process block 910. At process block 910, the method 900 turns off switches SW1 and SW2. The method continues to process block 915. At process block 915, the method 900 turns on switches SW3, SW4 and SW5. The method 900 continues to at 920. At 920, the method 900 sets EN=0, which sets ENb=1. The method continues to 925. At 925, the method 900 sets DIN=0, which sets DINb=1. The method continues to 930. At 930, the process 900 receives data.

If at 905, the mode is "transmit," then the method 900 continues to 935. At 935, the method 900 turns on switches SW1 and SW2. The method continues to 940. At 940, the method 900 turns off switches SW3, SW4 and SW5. The method 900 continues to 945. At 945, the method 900 sets EN=1, which sets ENb=0. The method 900 continues to 950. At 950, the method 900 applies data to DIN, which applies complemented data to DINb. The method continues to 955. At 955, the process 900 transmits data.

Although various embodiments have been described with reference to the figures, other embodiments are possible. For example, some embodiments may be paralleled in multiple slices. The slices may be enabled and disabled in order to adjust various parameters. In an FPGA fabric with a bidirectional port operating in a TX mode, some embodiments may provide a programmable voltage swing that may be set, for example, either dynamically in operation or by the user. The voltage swing may be adjusted, for example, to correspond to the interface specifications for voltage according to the drive and impedance characteristics of the circuit it is in. In some embodiments, an identification algorithm may receive information sufficient to identify the electrical characteristics required for compatibility with a circuit configuration that is determined in the field. As such, a preprogrammed array of potential voltage swing and output impedance characteristics may be accessed to optimize the interface with a variety of potential implementations that can occur while deployed in the field. Similarly, RX electrical characteristics may be field configured according to predetermined criteria to match the electrical characteristics that may be encountered in operation in the field.

In some embodiments, a static setting may be encoded for voltage swing, output impedance, and/or input/common-mode characteristics. In some embodiments, a static configuration setting may be implemented as a hardware configuration in the programmed fabric of an FPGA. For implementations that employ data storage media, a static setting may be loaded, for example, into a configuration file in memory registers, retrieved upon power-up, and applied to configure the hardware.

Various embodiments may be used to receive data signals and/or clock signals. External signals may be AC-coupled to the bidirectional port, for example, through series capacitors. In operation, some embodiments may be configured to receive and/or transmit differential signals. Some differential signals may present a common mode offset that may be substantially compensated by the application of common mode voltage in the termination circuit.

Some embodiments may operate with a single-ended signal. Single-ended inputs may eliminate one of the ports, such as the pins 305, 310 described with reference to FIG. 3.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

In some implementations, a pair of electrical nodes is configured to bidirectionally convey differential electrical signals from the transmit driver circuit (325) to a pair of terminals (305, 310) and to convey differential electrical signals from the pair of terminals (305, 310) to the receiver buffer circuit (330).

Some embodiments may incorporate a thin gate dielectric construction, for example, in the TX driver circuits. In certain implementations, the thin gate dielectric may include oxide as the dielectric. By way of example and not limitation, the thin gate dielectric may include other dielectric materials, such as, for example, SiN (silicon nitride).

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A bidirectional interface apparatus, the apparatus comprising:
   a pair of terminals configured to electrically connect to a differential circuit;
   a pair of electrical nodes, each of the electrical nodes electrically coupled to a corresponding one of the pair of terminals;
   a transmit driver circuit coupled to each of the pair of terminals via the pair of electrical nodes, wherein the transmit driver circuit comprises a plurality of slices, each slice in the plurality of slices comprising:
   (i) an output driver circuit; and,
   (ii) a programmable pre-driver circuit coupled to selectively enable or disable the output driver circuit in the same slice in response to an enable signal,
   a receive buffer circuit coupled to each of the pair of terminals via the pair of electrical nodes; and,
   a control circuit coupled to the transmit driver circuit, wherein the control circuit is configured to determine a number of the slices to selectively enable as a function of the transmit driver circuit output resistance.

2. The apparatus of claim 1, wherein, in the receive mode, the programmable pre-driver circuit is configured to supply a predetermined operating voltage to a control terminal of each of a plurality of transistors in the transmit driver circuit, wherein each of the plurality of transistors in the transmit driver circuit directly connect to the pair of electrical nodes.

3. The apparatus of claim 2, wherein the plurality of transistors in the transmit driver circuit comprise CMOS devices formed with a thin gate dielectric construction.

4. The apparatus of claim 2, wherein the predetermined operating voltage supplied to the control terminal of each of the plurality of transistors in the transmit driver circuit is between about 0.6V and about 1.0V.

5. The apparatus of claim 1, wherein, in response to the receive mode, a switch is selectively opened to interrupt a current from at least one of the pair of electrical nodes to a reference potential, wherein the current path runs through at least a portion of the transmit driver circuit.

6. The apparatus of claim 1, further comprising a first variable resistance circuit configured to adjust an output resistance of the output driver circuit in response to a first variable resistance control signal.

7. The apparatus of claim 6, further comprising a high side voltage regulator circuit configured to supply a regulated upper voltage via the first variable resistance circuit.

8. The apparatus of claim 7, wherein the output driver circuit in each slice is configured to drive an output signal as a differential output signal with an upper bound voltage swing established by the regulated upper voltage.

9. The apparatus of claim 6, wherein the transmit driver circuit further comprises a second variable resistance circuit connected between the transmit driver circuit and a circuit reference potential and configured to adjust an output resistance of the output driver circuit in response to a second variable resistance control signal.

10. The apparatus of claim 1, further comprising a resistive terminator network connected between the pair of electrical nodes and operable, in response to the receive mode, to close a first switch and a second switch to make electrical connections from a common mode node to each of the nodes in the pair of electrical nodes, each of the made connections being though a resistance sized to substantially match a common mode impedance characteristic, and wherein, the resistive terminator network is further operable, in response to the transmit mode, to open the first switch and the second switch, and wherein the common mode node is driven to a predetermined regulated voltage.

11. The apparatus of claim 1, wherein, when the output driver is selectively enabled by the programmable pre-driver circuit, the output driver circuit is operable to drive a differential output signal onto the pair of electrical nodes in response to a data signal.

12. The apparatus of claim 1, wherein the receive buffer circuit is, in a receive mode, to receive incoming differential signals via the pair of electrical nodes.

13. The apparatus of claim 1, wherein when operating in a transmit mode, the control circuit is configured to selectively generate the enable signal for each slice in the plurality of slices.

14. A method of operating a bidirectional interface apparatus, the method comprising:
- electrically connecting a pair of terminals to a differential circuit;
- electrically coupling a pair of electrical nodes to a corresponding one of the pair of terminals;
- coupling a transmit driver circuit to each of the pair of terminals via the pair of electrical nodes, wherein the transmit driver circuit comprises a plurality of slices, each slice in the plurality of slices comprising:
  - (i) an output driver circuit; and,
  - (ii) a programmable pre-driver circuit coupled to selectively enable or disable the output driver circuit in the same slice in response to an enable signal;
- coupling a receive buffer circuit to each of the pair of terminals via the pair of electrical nodes;
- in a receive mode, receiving, with the receive buffer circuit, incoming differential signals via the pair of electrical nodes; and,
- determining, with the control circuit, a number of the slices to selectively enable as a function of the transmit driver circuit output resistance.

15. The method of claim 14, further comprising, in the receive mode, supplying, with the programmable pre-driver circuit, a predetermined operating voltage to a control terminal of each of a plurality of transistors in the transmit driver circuit, wherein each of the plurality of transistors in the transmit driver circuit directly connect to the pair of electrical nodes.

16. The method of claim 14, wherein, in response to the receive mode, selectively opening a switch to interrupt a current from at least one of the pair of electrical nodes to a reference potential, wherein the current path runs through at least a portion of the transmit driver circuit.

17. The method of claim 14, further comprising adjusting, with a first variable resistance circuit, an output resistance of the output driver circuit in response to a first variable resistance control signal.

18. The method of claim 17, further comprising supplying, with a high side voltage regulator circuit, a regulated upper voltage via the first variable resistance circuit.

19. The method of claim 18, further comprising driving, with the output driver circuit in each slice, an output signal as a differential output signal with an upper bound voltage swing established by the regulated upper voltage.

20. The method of claim 18, further comprising adjusting, with a second variable resistance circuit connected between the transmit driver circuit and a circuit reference potential, an output resistance of the output driver circuit in response to a second variable resistance control signal.

* * * * *